US005831815A

United States Patent [19]

Miller et al.

[11] Patent Number: 5,831,815

[45] Date of Patent: Nov. 3, 1998

[54] PROGRAMMABLE BACKSHELL FOR AN ELECTRICAL CONNECTOR

[75] Inventors: George Dean Miller, Harrisburg; William Gary Lenker, Marysville, both of Pa.

[73] Assignee: The Whitaker Corporation, Wilmington, Del.

[21] Appl. No.: 823,033

[22] Filed: Mar. 31, 1997

[51] Int. Cl.[6] .......... H05K 5/00

[52] U.S. Cl. .......... 361/679; 361/679; 361/437; 439/610; 439/455; 439/731; 439/465; 439/466

[58] Field of Search .......... 361/679, 437; 439/610, 465, 466, 468, 455, 731, 98, 99

[56] References Cited

U.S. PATENT DOCUMENTS

| | | | |
|---|---|---|---|
| 4,272,148 | 6/1981 | Knack, Jr. | 439/455 |
| 4,549,780 | 10/1985 | Bertini et al. | 339/107 |
| 4,952,168 | 8/1990 | Schieferly et al. | 439/467 |

FOREIGN PATENT DOCUMENTS

| | | | |
|---|---|---|---|
| 0168014 | 7/1985 | European Pat. Off. | H01R 13/639 |

OTHER PUBLICATIONS

*AMP Instruction Sheet IS 6609*, "AMP Amplimite HD–20 Shielded Cable Clamp Kits", six pages; Mar. 1987; AMP Incorporated, Harrisburg, PA.

AMP Catalog 82068, HDP–22 Crimp Snap–In Connectors, p. 13, (1996), AMP Incorporated, Harrisburg, PA.

*AMP Customer Drawing No. 205207*, "Plug Connector, Size 3, 25 Pos., Amplimite HDP", (1985), AMP Incorporated, Harrisburg, PA.

*AMP Customer Drawing No. C–205208*, "Receptacle Connector, Size 3, 25 Pos., Amplimite HDP", (1985), AMP Incorporated, Harrisburg, PA.

amp.com internet home page of AMP Incorporated, Plug p/n 748473–1, Feb. 3, 1998.

AMP Catalog 82068, HDP–22 "Crimp Snap–In Contact Connectors", p. 13, Jan. 1996.

*Primary Examiner*—Leo P. Picard
*Assistant Examiner*—Boris L. Chervinsky
*Attorney, Agent, or Firm*—Anton P. Ness

[57] ABSTRACT

A backshell construction for an electrical connector which allows multiple cable exits, multiple cable exit directions and multiple cable sizes. A conductive ferrule having a fixed size clamp portion is utilized as an adaptor for different size cables. The backshell is constructed of a pair of duplicate hermaphroditic conductive bodies wherein the rear and side walls may have one or more cable cutouts with engagement structure for gripping the ferrule on each of the cables.

10 Claims, 3 Drawing Sheets

PROGRAMMABLE BACKSHELL FOR AN ELECTRICAL CONNECTOR

BACKGROUND OF THE INVENTION

This invention relates to a conductive backshell for an electrical connector and, more particularly, to a universal backshell which accommodates multiple cables, multiple sizes of cables and multiple directions for cables to enter/exit the backshell.

Currently, backshells holding a D-type electrical connector are constructed to provide only one cable exit, one cable size and one cable exit direction. Therefore, this results in the requirement that separate tooling be manufactured for each configuration of backshell. It would therefore be desirable to have a backshell construction which minimizes the tooling required to accommodate the various requirements for number of cables, cable sizes and cable entry/exit directions.

SUMMARY OF THE INVENTION

According to the present invention, a backshell construction is provided which allows multiple cable exits, multiple cable exit directions and multiple cable sizes. This construction is operative with a conductive grounding ferrule on the cable which includes a fixed size clamp portion irrespective of the size of the cable. The backshell is constructed of a pair of complementary conductive bodies each of which has a substantially planar major wall and a front wall orthogonal to the major wall. The front wall is formed with a connector cutout for exposing a mating face of a connector. A rear wall parallel to the front wall has at least one cable cutout therein. Each cable cutout allows one cable to pass therethrough and has a substantially semi-cylindrical portion with its axis orthogonal to the rear wall and with a diameter sufficient to accept the ferrule clamp portion. The body further has a pair of opposed side walls each orthogonal to the major wall and extending between respective ends of the front and rear walls so as to form a cavity together with the front, rear and major walls. The front, rear and side walls are so positioned and dimensioned that when the pair of complementary bodies are placed one over the other with their front walls abutting and their rear walls abutting, there is formed a hollow backshell where respective corresponding pairs of cutouts on the pair of complementary bodies are aligned so as to form apertures through which the interior of the backshell is accessible. Selected ones of the cable cutout semi-cylindrical portions are provided with engagement structure so that when the pair of complementary bodies are placed one over the other to form the hollow backshell there is engagement structure provided in each of the apertures for securely engaging a ferrule clamp portion associated with that aperture. Preferably, the conductive bodies are identical, and therefore are hermaphroditic.

In accordance with an aspect of this invention, each cable cutout is formed with an arcuate groove in a plane parallel to the rear wall. A circular disc is provided, which can be inserted in a groove of an unused cable cutout so as to be captured between the pair of duplicate hermaphroditic bodies and close off the aperture associated with the unused cable cutout.

In accordance with another aspect of this invention, the side walls are also provided with cable cutouts substantially identical to the cable cutout of the rear wall.

In accordance with a further aspect of this invention, the engagement structure comprises an embossment in each of the at least one cable cutout semi-cylindrical portions.

In accordance with yet another aspect of this invention, the engagement structure comprises an elongated finger extending parallel to the rear wall into an associated cable cutout semi-cylindrical portion and substantially tangential thereto so that a ferrule clamp portion in the associated cable cutout semi-cylindrical portion engages and laterally deflects the finger.

In accordance with still another aspect of this invention, each cable cutout is formed with an arcuate groove in a plane parallel to the rear wall. There is provided an aperture plug member which includes a generally flat circular cap, and a plurality of fingers secured to the cap and extending in the same direction away from the cap, each of the fingers being bent outwardly and inwardly relative to an axis orthogonal to and centrally of the cap at substantially the same distance from the cap so that the outer extent of all the fingers lies along a circle in a plane generally parallel to the cap, the diameter of the circle being such that when the fingers are inserted into one of the apertures the fingers engage the groove to retain the plug member within that cable cutout.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
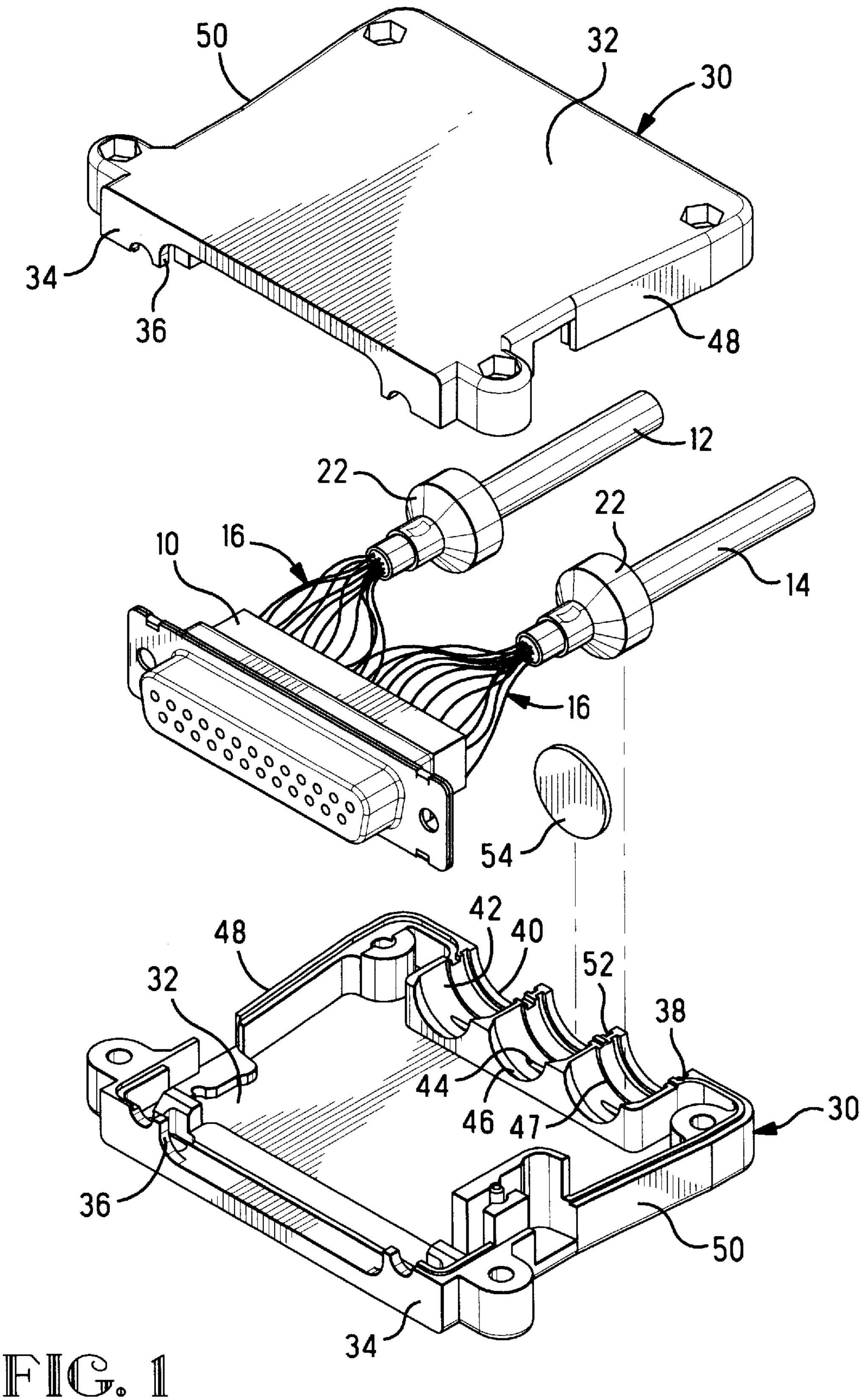
FIG. 1 is an exploded isometric view of an electrical connector and associated cables, and an embodiment of a pair of conductive backshell bodies in accordance with the principles of this invention.

As shown in FIG. 1, the inventive combination includes a connector 10 having, illustratively, two cables 12, 14 secured thereto. Each of the cables 12, 14 includes a plurality of individual insulated wires 16 surrounded by a conductive shield 18 (FIG. 2) and an outer insulating sheath 20.

Figure 2:
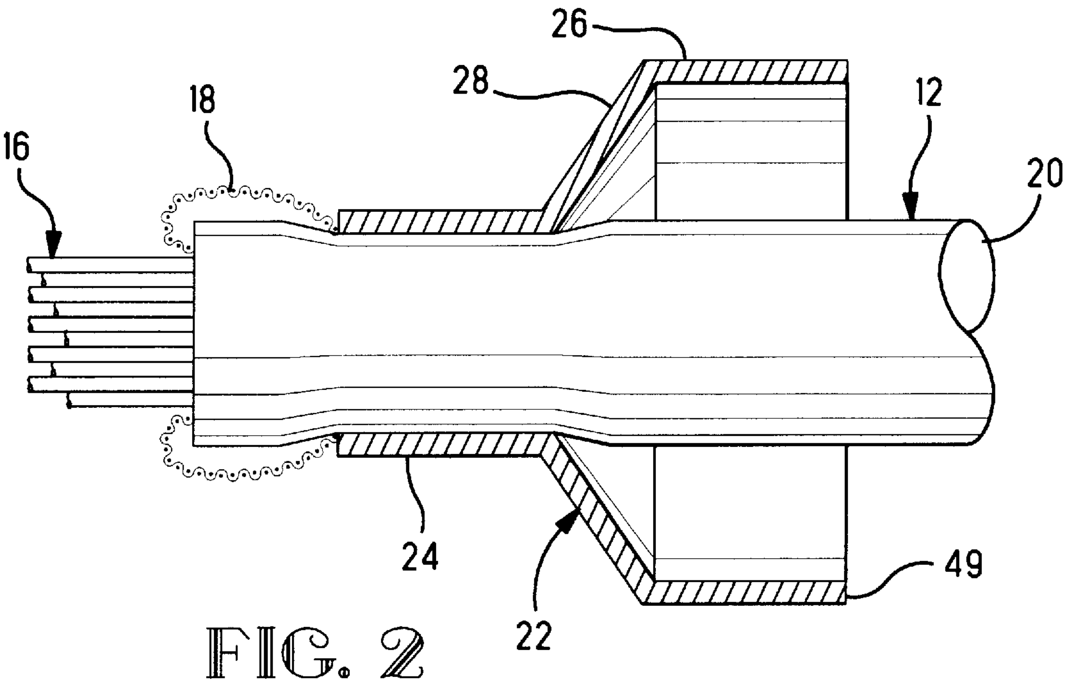
FIG. 2 is a cross sectional view showing a ferrule used with the backshell of FIG. 1 secured to a cable.

Each of the cables 12, 14 is associated with a respective conductive ferrule 22. The ferrule 22 includes a cylindrical crimp portion 24 of diameter corresponding to the outer diameter of the insulating sheath 20 of its associated cable. As shown in FIG. 2, the crimp portion 24 is crimped to the sheath 20 with the conductive shield 18 being folded back and under the crimp portion 24 to make secure engagement therewith. The ferrule 22 further has a cylindrical clamp portion 26 which is coaxial with, and axially displaced from, the crimp portion 24. The outer diameter of the clamp portion 26 is larger than that of the crimp portion 24 and is the same for all ferrules, irrespective of the size of the cable to which it is secured. This enables the ferrule 22 to act as an adaptor to accommodate different size cables. Finally, the ferrule 22 includes an intermediate portion such as a tapered portion 28 joining the crimp portion 24 and the clamp portion 26.

The conductive backshell comprises a pair of complementary and preferably duplicate hermaphroditic conductive bodies 30 which surround and contain the connector 10 and securely engage the ferrules 22 so as to be electrically connected to the conductive shield 18. As shown, each of the bodies 30 includes a substantially planar major wall 32 and a front wall 34 orthogonal to the major wall 32. The front wall 34 is formed with a connector cutout 36 and other features for holding the connector 10 while exposing its mating face. These particular features and the use of a cutout are conventional in the art and will not be described in any further detail herein.

The body 30 is further formed with a rear wall 38 which is parallel to the front wall 34 and has at least one cable cutout 40 therein. As illustrated in FIG. 1, there are three such cable cutouts 40. Each of the cable cutouts 40 functions as an entry/exit for a respective cable secured to the connector 10. As shown, the cable cutouts 40 are in a thickened portion of the rear wall 38. Each cable cutout 40 has a substantially semi-cylindrical portion 42 with its axis orthogonal to the rear wall 38. The semi-cylindrical portion 42 has a diameter sufficient to accept the ferrule clamp portion 26 with slight clearance and is further formed with engagement structure, illustratively an embossment 44, which insures engagement with the ferrule clamp portion 26. The inner end of the semi-cylindrical portion 42 is terminated by an inwardly tapered portion 46 adapted for receipt of the ferrule tapered portion 28. A wall 47 terminating the outer end of the semi-cylindrical portion 42 provides interference for the outer end 49 of the ferrule 22 clamp portion 26. Thus, the clamp portion 26 is retained longitudinally between the taper 46 and the wall 47 of the cable cutout 40.

The body 30 is further formed with a pair of opposed side walls 48, 50 which are each orthogonal to the major wall 32. Each of the side walls 48, 50 extends between respective ends of the front wall 34 and the rear wall 38. Accordingly, the major wall 32, the front wall 34, the rear wall 38, and the side walls 48, 50 together define a cavity. The front wall 34, the rear wall 38 and the side walls 48, 50 are so positioned and dimensioned, along with the positions and dimensions of their respective cutouts and other features, that when the pair of duplicate hermaphroditic bodies 30 are placed one over the other with their front walls 34 abutting and their rear walls 38 abutting, there is formed a hollow backshell where respective corresponding pairs of cutouts 36, 40 on the pair of bodies 30 are so aligned as to form apertures through which the interior of the backshell is accessible.

In the illustration of FIG. 1, there are three cable cutouts 40, whereas there are only two cables 12, 14. Therefore, one of the cable cutouts 40 is not used. In order to close off the aperture associated with the unused pair of cable cutouts, in accordance with an embodiment of this invention, each of the cable cutouts 40 is formed with an arcuate groove 52 in a plane parallel to the rear wall 38 and outwardly of the wall 47. Preferably, the grooves 52 are aligned with each other and are closely adjacent the outward extremity of the cable cutouts 40. To close off the unused aperture, a circular disc 54 is provided. The disc 54 is adapted for insertion in the groove 52 of the unused cable cutout 40 and is captured between the pair of bodies 30 to close off the aperture associated with the unused cable cutouts.

Figure 3:
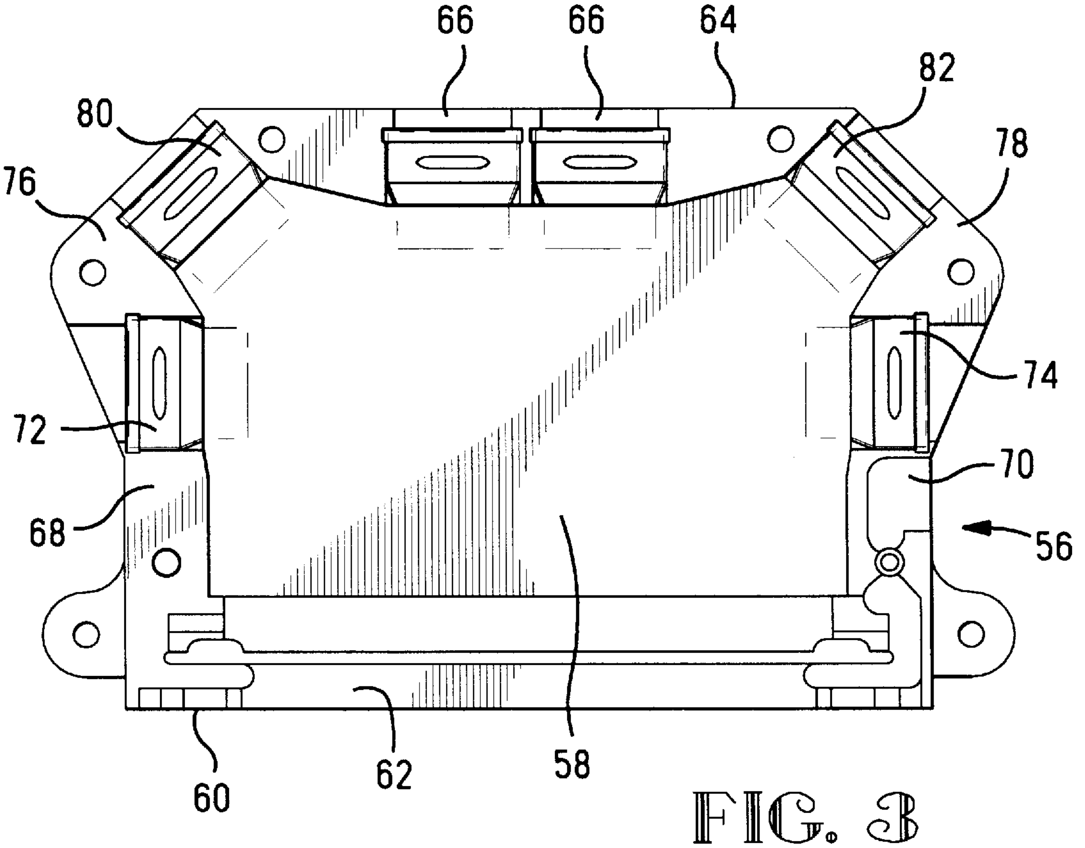
FIG. 3 is a top plan view of an alternate embodiment of a hermaphroditic body for a backshell according to this invention.

The embodiment illustrated in FIG. 1 provides three cable cutouts 40 all along the rear wall 38. It is understood that more or less than three cable cutouts can be provided. In addition, it may be desired to provide cable cutouts which allow cables to enter/exit the backshell other than from its rear. Accordingly, an alternate embodiment of a backshell body is shown in FIG. 3 and is designated by the reference numeral 56.

The backshell body 56 is one of a pair of duplicate hermaphroditic bodies which together form a complete backshell. The backshell body 56 is similar to the backshell body 30 in that it includes a major wall 58 and a front wall 60 having a connector cutout 62. However, the rear wall 64 only includes two cable cutouts 66, each of which is substantially identical to the cable cutouts 40. In addition, the side walls 68, 70 are each formed with a respective cable cutout 72, 74, each substantially identical to the cable cutouts 66. Since the body 56 is one of a pair of duplicate hermaphroditic bodies, the side walls 68, 70 must have an equal number of cable cutouts which are so aligned as to each form an aperture with a corresponding cable cutout on the abutting side wall of the other one of the pair of duplicate hermaphroditic bodies when the pair of duplicate hermaphroditic bodies are placed one over the other to form a backshell. The cable cutouts 72, 74 allow side entry/exit of connector cables.

There are times when a different angle of cable entry/exit is desired. Accordingly, as shown in FIG. 3, each of the side walls 68, 70 may be formed with a respective angled portion 76, 80 adjacent the rear wall 64 which extends at an angle of approximately 45° C. to the rear wall 64. Each of the side wall angled portions 76, 78 is formed with a respective cable cutout 80, 82 which is substantially identical to the cable cutouts 66. Again, the side wall angled portions 76, 78 must be formed with an equal number of cable cutouts which are so aligned as to each form an aperture with a corresponding cable cutout on the abutting side wall angled portion of the other one of the pair of duplicate hermaphroditic bodies when the pair of duplicate hermaphroditic bodies are placed one over the other to form a backshell. Although in FIG. 3 the side walls and their angled portions are shown as each having a single cable cutout, it is understood that this number may be changed, based upon individual requirements.

Figure 4:
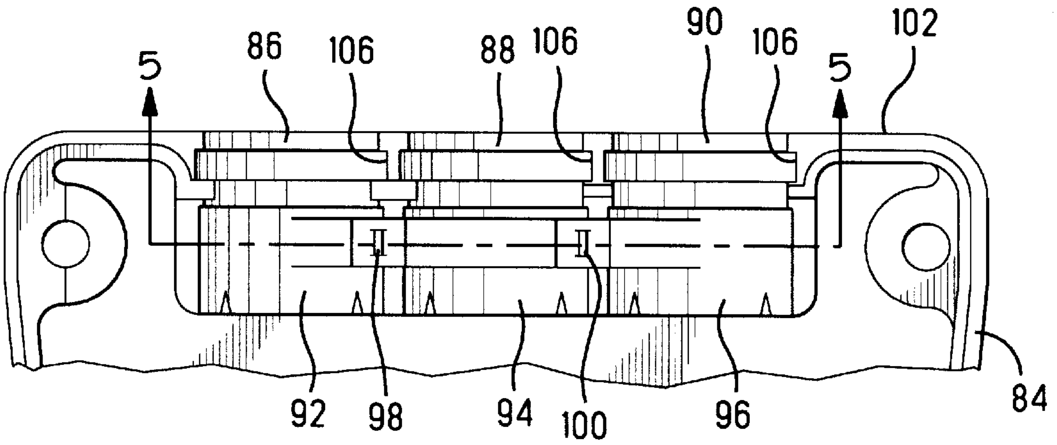
FIG. 4 is a partial top plan view of another embodiment of a hermaphroditic body for a backshell according to this invention.
Figure 5:
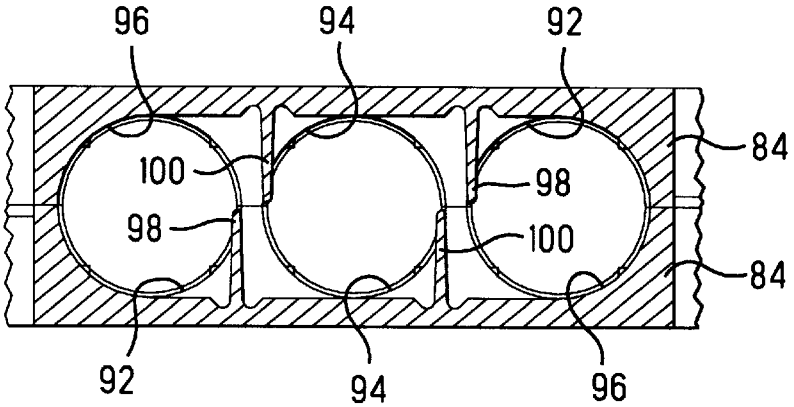
FIG. 5 is a partial cross sectional view of a pair of the bodies of FIG. 4, each taken along the line 5—5 in FIG. 4, and assembled to form a backshell.

FIGS. 4 and 5 illustrate an embodiment of the present invention wherein the engagement structure for insuring engagement with the ferrule clamp portion 26 is an elongated finger. As illustrated, the backshell body 84 has three cable cutouts 86, 88, 90, each with a respective semi-cylindrical portion 92, 94, 96. In this embodiment, the engagement structure includes a first elongated finger 98 associated with the semi-cylindrical portion 92 and a second elongated finger 100 associated with the semi-cylindrical portion 94. Each of the elongated fingers 98, 100 extends parallel to the rear wall 102 of the body 84 into its associated cable cutout semi-cylindrical portion and substantially tangential thereto, so that a ferrule clamp portion 26 in the associated cable cutout semi-cylindrical portion engages and laterally deflects the associated finger. It is noted that the finger 98 is provided for semi-cylindrical portion 92 and the finger 100 is provided for semi-cylindrical portion 94, whereas no finger is provided for semi-cylindrical portion 96. However, as is clear from FIG. 5, when the pair of bodies 84 are placed one over the other to form a backshell, each of the complete cable cutouts has at least one finger for engaging a ferrule clamp portion 26 installed in that cable cutout.

Figure 6:
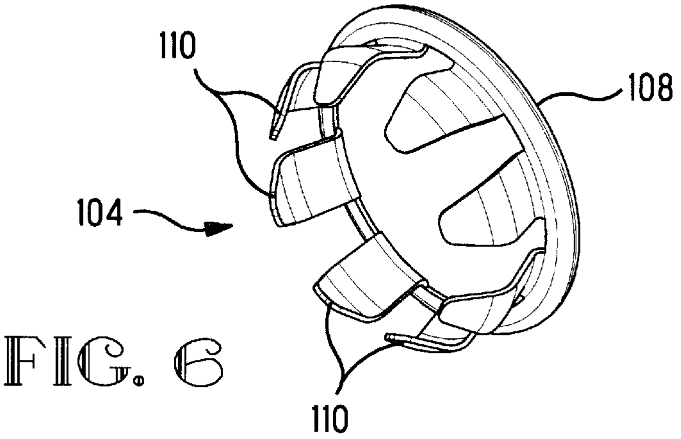
FIG. 6 is an isometric view of an aperture plug member according to an embodiment of this invention.

As an alternate to the disc 54 (FIG. 1) for closing off an unused cable cutout, there may be provided an aperture plug member 104, as shown in FIG. 6. As before, the cable cutouts 86, 88, 90 are each formed with an arcuate groove 106 in a plane parallel to the rear wall 102. The plug member 104 is preferably a unitary member stamped and formed from sheet metal to include a generally flat circular cap 108 and a plurality of fingers 110 secured to the cap 108 and extending in the same direction away from the cap 108. Each of the fingers 110 is bent outwardly and inwardly relative to an axis orthogonal to and centrally of the cap 108 at substantially the same distance from the cap so that the outer extent of all of the fingers 110 lies along a circle in a plane generally parallel to the cap 108. The diameter of that circle is such that when the fingers 110 are inserted into an aperture formed when a pair of the bodies 84 are placed one over the other, the fingers 110 are deflected inwardly and then snap into and engage the groove 106 to retain the plug member 104 within the pair of cable cutouts forming that aperture. Preferably, the diameter of the cap 108 is larger than the diameter of the aperture so that the cap 108 remains outside the backshell when the fingers 110 engage the groove 106.

Accordingly, there have been disclosed embodiments of a universal backshell which accommodates multiple cables, multiple sizes of cables and multiple directions for cables to enter/exit the backshell. While alternative embodiments of the present invention have been disclosed herein, it will be apparent to one of ordinary skill in the art that various modifications and adaptations to the disclosed embodiments are possible and it is intended that this invention be limited only by the scope of the appended claims.

What is claimed is:

1. In combination:

- an electrical connector secured to at least one cable, each of said at least one cable including a plurality of individual insulated wires surrounded by a conductive shield and an outer insulating sheath;
- at least one conductive ferrule each associated with a respective one of said at least one cable, each of said at least one conductive ferrule including:
  - a cylindrical crimp portion of diameter corresponding to the outer diameter of the insulating sheath of said associated cable and adapted for engagement with the conductive shield of said associated cable;
  - a cylindrical clamp portion coaxial with and axially displaced from said crimp portion, wherein the clamp portion of all of said ferrules have the same predetermined outer diameter larger than the diameter of any corresponding crimp portion; and
  - an intermediate portion joining said crimp portion and said clamp portion; and
- a conductive backshell having an interior adapted to encircle said connector and adapted to accept multiple sizes of cable, the backshell comprising a pair of complementary conductive bodies each including:
  - a substantially planar major wall;
  - a front wall orthogonal to said major wall and having a connector cutout for exposing a mating face of said connector;
  - a rear wall parallel to said front wall and having at least one cable cutout therein, each of said at least one cable cutout allowing one of said at least one cable to pass therethrough, each of said at least one cable cutout having a semi-cylindrical portion with its axis orthogonal to said rear wall and having a diameter sufficient to accept said ferrule clamp portion; and
  - a pair of opposed side walls each orthogonal to said major wall and each extending between respective ends of said front and rear walls so as to form a cavity together with said front, rear and major walls;
  - wherein the front, rear and side walls are so positioned and dimensioned that when the pair of complementary bodies are placed one over the other with their front walls abutting and their rear walls abutting there is formed a hollow backshell where respective corresponding pairs of cutouts on the pair of complementary bodies are aligned so as to form apertures through which the interior of the backshell is accessible; and
  - wherein selected ones of said at least one cable cutout semi-cylindrical portion includes engagement structure so that when the pair of complementary bodies are placed one over the other to form said hollow backshell there is engagement structure provided in each of said apertures for securely engaging a ferrule clamp portion associated with said each of said apertures.

2. The combination according to claim 1 wherein said at least one cable cutout is formed with an arcuate groove in a plane parallel to said rear wall and said combination further includes:

- a circular disc adapted for insertion in said groove so as to be captured between said pair of complementary bodies and close off the aperture associated with said at least one cable cutout.

3. The combination according to claim 1 wherein each of said side walls is formed with at least one cable cutout , and wherein said side walls have an equal number of cable cutouts so aligned as to each form an aperture with a corresponding cable cutout on the abutting side wall of the other one of said pair of complementary bodies when said pair of complementary bodies are placed one over the other to form said backshell.

4. The combination according to claim 1 wherein said pair of side walls are each formed with an angled portion adjacent said rear wall which extends at an angle to said rear wall, and said angled portions are each formed with at least one cable cutout , and wherein said angled portions have an equal number of cable cutouts so aligned as to each form an aperture with a corresponding cable cutout on the abutting angled portion of the other one of said pair of complementary bodies when said pair of complementary bodies are placed one over the other to form said backshell.

5. The combination according to claim 1 wherein said intermediate portion of said ferrule is tapered, and said at least one cable cutout is further formed with an inwardly tapered portion adjacent to and inward of said semi-cylindrical portion for receiving the ferrule tapered portion.

6. The combination according to claim 1 wherein said complementary conductive bodies are identical to each other and are hermaphroditic.

7. The combination according to claim 1 wherein said engagement structure comprises an embossment in each of said at least one cable cutout semi-cylindrical portion.

8. The combination according to claim 1 wherein said engagement structure comprises an elongated finger extending parallel to said rear wall into an associated cable cutout semi-cylindrical portion and tangential thereto so that a ferrule clamp portion in said associated cable cutout semi-cylindrical portion engages and laterally deflects said finger.

9. The combination according to claim 1 wherein said at least one cable cutout is formed with an arcuate groove in a plane parallel to said rear wall and said combination further comprises an aperture plug member including:

a circular cap; and a plurality of fingers secured to said cap and extending in the same direction away from said cap, each of said fingers being bent outwardly and inwardly relative to an axis orthogonal to and centrally of said cap at the same distance from said cap so that the outer extent of all said fingers lies along a circle in a plane parallel to said cap, the diameter of said circle being such that when said fingers are inserted into one of said apertures said fingers deflect inwardly and then snap into and engage said groove to retain the plug member within that cable cutout.

10. The combination according to claim 9 wherein the diameter of said cap is larger than the diameter of said semi-cylindrical portion so that said cap remains outside said backshell when said plug member fingers engage said groove.

* * * * *